United States Patent
Wells et al.

(10) Patent No.: US 11,252,821 B2
(45) Date of Patent: Feb. 15, 2022

(54) OPTICAL SURFACE-MOUNT DEVICES

(71) Applicant: CoreLED Systems, LLC, Livonia, MI (US)

(72) Inventors: Brian C. Wells, Grosse Pointe Farms, MI (US); Derek Mallory, Northville, MI (US); John Kahl, Troy, MI (US); Dianna Stadtherr, Novi, MI (US); Stephen Godwin, Oxford, MI (US); Robert Salton, Pontiac, MI (US)

(73) Assignee: CoreLED Systems, LLC

( * ) Notice: Subject to any disclaimer, the term of this patent is extended or adjusted under 35 U.S.C. 154(b) by 0 days.

(21) Appl. No.: 16/539,399

(22) Filed: Aug. 13, 2019

(65) Prior Publication Data

US 2021/0051802 A1    Feb. 18, 2021

(51) Int. Cl.
*G02B 6/42* (2006.01)
*H05K 1/18* (2006.01)

(52) U.S. Cl.
CPC ............ *H05K 1/181* (2013.01); *G02B 6/428* (2013.01); *G02B 6/4214* (2013.01); *H05K 2201/10106* (2013.01); *H05K 2201/10121* (2013.01); *H05K 2201/10946* (2013.01)

(58) Field of Classification Search
CPC ........ G02B 6/42; G02B 6/4214; G02B 6/428; G02B 6/0083; H05K 2201/10121; H05K 1/181; H05K 2201/10106
See application file for complete search history.

(56) References Cited

U.S. PATENT DOCUMENTS

| | | | |
|---|---|---|---|
| 4,629,278 A * | 12/1986 | Norton | H05K 3/341 439/570 |
| 6,940,704 B2 | 9/2005 | Stalions | |
| 7,566,154 B2 | 7/2009 | Gloisten et al. | |
| 7,989,839 B2 | 8/2011 | Dahm | |
| 8,172,434 B1 | 5/2012 | Olsson | |
| 8,585,242 B2 | 11/2013 | Walczak et al. | |
| 8,648,359 B2 | 2/2014 | Hussell et al. | |
| 8,883,048 B2 | 11/2014 | Hashimoto et al. | |
| 9,039,239 B2 * | 5/2015 | Walczak | F21V 17/16 362/294 |
| 9,328,902 B2 | 5/2016 | Eckert et al. | |
| 2005/0089264 A1 * | 4/2005 | Johnson | G02B 6/12004 385/15 |
| 2006/0024005 A1 * | 2/2006 | Ice | H05K 3/3405 385/92 |
| 2008/0191335 A1 | 8/2008 | Yang et al. | |

(Continued)

FOREIGN PATENT DOCUMENTS

EP    1714327    10/2006

OTHER PUBLICATIONS

Extended European Search Report dated Feb. 16, 2021, 8 pages.

*Primary Examiner* — Jennifer Doan
(74) *Attorney, Agent, or Firm* — Butzel Long, PC; Gunther Evanina

(57) ABSTRACT

An optical surface-mount device has a dielectric body and a solderable support connected with the dielectric body to facilitate solder reflow mounting of the device to a printed circuit board. The device can include a reflector or other functional features that enhance or protect the functionality of an electronic component mounted on the same printed circuit board.

15 Claims, 6 Drawing Sheets

(56) References Cited

U.S. PATENT DOCUMENTS

| | | | |
|---|---|---|---|
| 2009/0065936 A1* | 3/2009 | Ong | ............... H05K 1/111 257/738 |
| 2013/0319507 A1 | 12/2013 | Hasin et al. | |
| 2014/0191263 A1 | 7/2014 | Wang et al. | |
| 2014/0233245 A1 | 8/2014 | Kerpe | |
| 2015/0219285 A1 | 8/2015 | Rantala | |
| 2016/0315240 A1 | 10/2016 | Kums et al. | |

\* cited by examiner

OPTICAL SURFACE-MOUNT DEVICES

CROSS-REFERENCE TO RELATED APPLICATIONS

Not Applicable.

FIELD OF THE DISCLOSURE

This disclosure relates to surface-mount devices and improvements in surface-mount technology.

BACKGROUND OF THE DISCLOSURE

Surface-mount technology has been generally limited to installation of electronic devices onto a printed circuit board, with non-electronic, functional components being added in separate steps using different technology.

U.S. Pat. No. 8,585,242 describes a securement ring adapted to hold a lens and which is surface mountable to a printed circuit board.

SUMMARY OF THE DISCLOSURE

This disclosure provides methods of using surface-mount technology to install optical components on a printed circuit board. The method can allow optical components to be installed on a printed circuit board simultaneously with electronic components to reduce the number of steps and/or the technologies needed to assemble certain devices.

DETAILED DESCRIPTION

Described herein are optical components that are mountable to a printed circuit board (PCB) using surface-mount technology in which solder reflow is used to permanently secure the optical component to the PCB. The optical components are supported by or integrated onto a surface mount device having a dielectric body and a solderable support connected with the dielectric body. As used herein, the term "optical component" includes lens, reflectors, filters, and polarizers.

Figure 1:
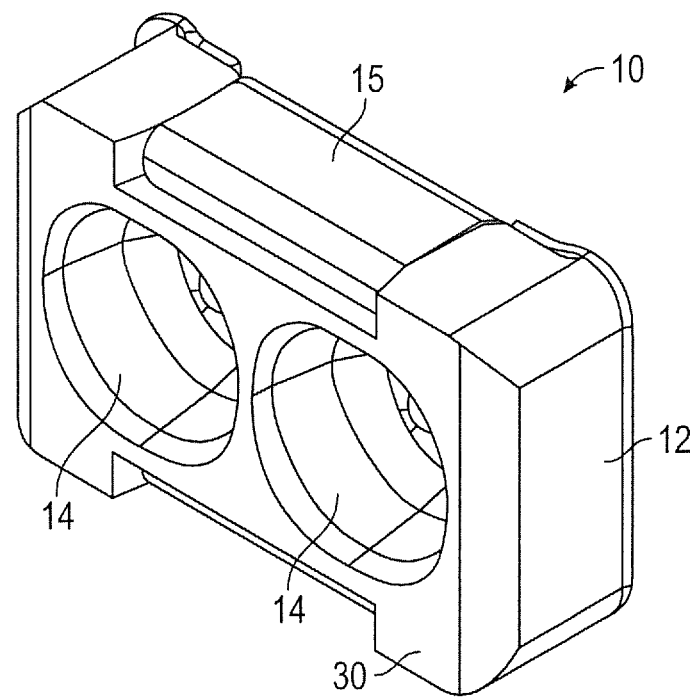
FIG. 1 is a perspective view of a surface-mount device in accordance with this disclosure.

A surface-mount device 10 having a dielectric body 12 defining functional features 14, and a lead frame clip 15 is shown in FIG. 1. Dielectric body 12 and lead frame clip 15 are configured to be reversibly or releasably connected together into a snap-fit assembly. As an alternative, the lead frame clip could be insert molded or overmolded with the dielectric body.

Figure 2:
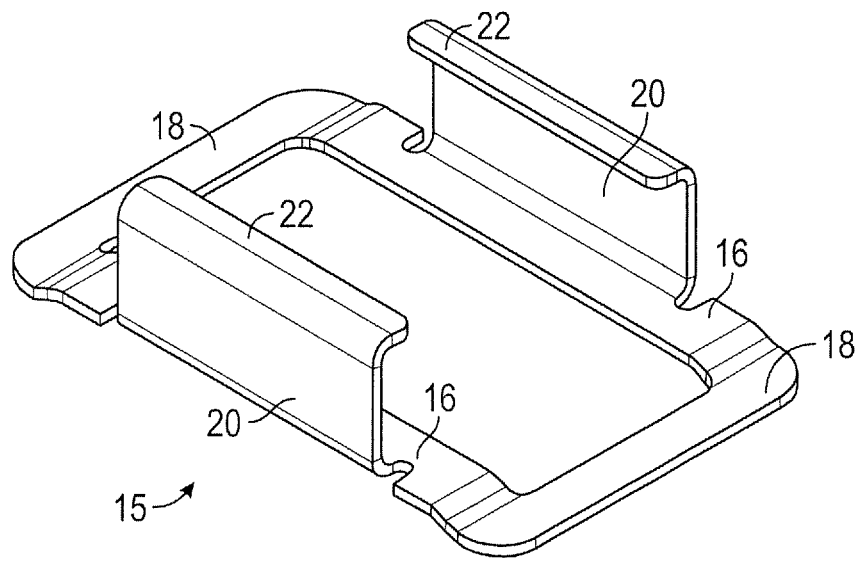
FIG. 2 is a perspective view of a component of the device shown in FIG. 1.

The lead frame clip 15 is shown by itself, separated from the dielectric body 12 in FIG. 2. The lead frame can be made of various solderable materials. Suitable solderable metal and metal oxide materials include phosphor bronze (an alloy of copper with 0.5% to 11% tin and 0.01% to 0.35% phosphorus), aluminum, aluminum alloys, beryllium, chromium, copper, copper alloys, germanium, gold, lead, magnesium, magnesium oxide, aluminum oxide, titanium oxide, molybdenum, nickel, nickel alloys, niobium, ruthenium, silicon, silver, stainless steel, tantalum, tin, titanium, titanium alloys, tungsten, zinc and zirconium. Suitable non-metallic solderable materials include alumina, beryllium, borosilicate glass, lead glass, mica, quartz glass, silica, silica glass, sodium lime glass and zircon. Metals, particularly copper alloys such as phosphor bronze are preferred for fabricating a suitably flexible and resilient lead frame clip 15.

Figure 3:
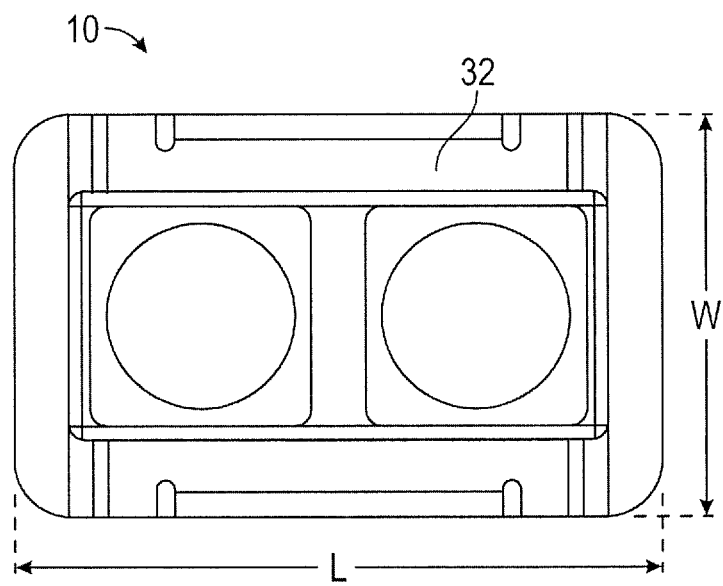
FIG. 3 is a bottom view of the device shown in FIG. 1.
Figure 4:
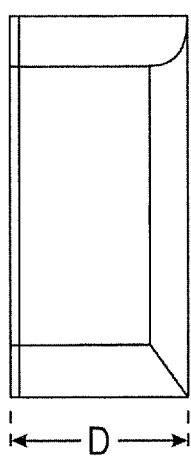
FIG. 4 is a side view of the device shown in FIG. 1.
Figure 5:
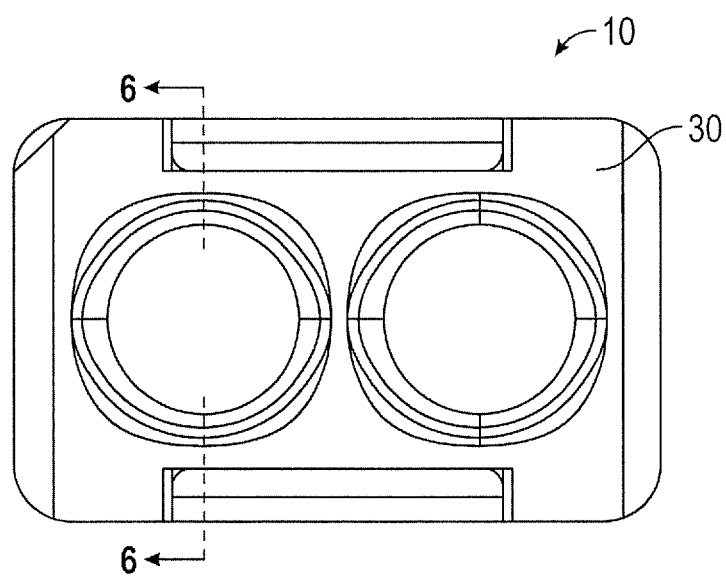
FIG. 5 is a top view of the device shown in FIG. 1.
Figure 6:
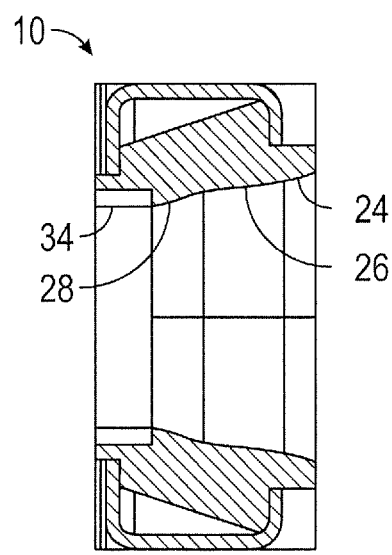
FIG. 6 is a side cross-sectional view of the device shown in FIG. 1.

Lead frame clip 15 includes a generally rectangular frame comprising longitudinal members 16, transverse solder pad members 18, and upstanding clip 20 having upper inwardly turned lips 22 that engage ledges at upper ends of side walls 24 of body 12. The lengths of longitudinal members 16 are substantially the same as the length dimension (L) of body 12 (FIG. 3), and the lengths of transverse members 18 are substantially the same as the width (W) dimension of body 12. The dimensions of body 12 are not limited, but are generally less than 20 mm, and more typically less than 10 mm. For example, in the illustrated embodiment, body 12 has a length of about 6.2 mm, a width of about 4.1 mm, and a depth (D) of about 3.5 mm. However, in certain applications dimensions greater than 20 mm may be desirable.

The term "dielectric", as used herein, refers to a material having an electrical conductivity that is less than that of typical semi-conductive materials, and can refer to those materials having an electrical conductivity that is less than $10^{-6}$ Ohm-meter. Suitable di-electrical materials from which body 12 can be fabricated include various polymeric (plastic) materials, ceramics, and glass. Particularly preferred are plastic materials that can be injection molded, including polybutylene terephthalate, polyethylene terephthalate, poly cyclohexylene-dimethylene terephthalate (PCT), acrylonitrile-butadiene-styrene terpolymer (ABS), polycarbonates, polyacrylates, polymethacrylates, polyesters, long alkyl chain polyphthalamide (PPA). These plastic materials may contain various fillers to provide desired physical and/or mechanical properties. For example, titanium dioxide can be added to provide a white pigment and/or diffusively scatter light, carbon black can be added to create a black appearance and absorb light, or glass and/or minerals could be added to increase rigidity.

Body 12 can be provided with optical features 14. In the illustrated embodiment (FIGS. 1-5), features 14 are reflectors comprising a plurality (e.g., three) of adjacent, concave, progressively narrower frusto-conical surfaces 24, 26 and 28 from top face 30 to bottom face 32. Surfaces 24, 26 and 28 are preferably provided with a metalized coating, such as nickel, silver or copper, using various known techniques, such as silver reduction metallization, vacuum metallizing, arc spray metallization and flame spray metallization. A cylindrical section 34 completes a through-hole that can be positioned to allow light from an LED mounted on a PCB to project through the cylindrical section 34 and be reflected at the frusto-conical reflector surfaces to direct light from the LED into a desired beam pattern (e.g., a focused beam).

Figure 7:
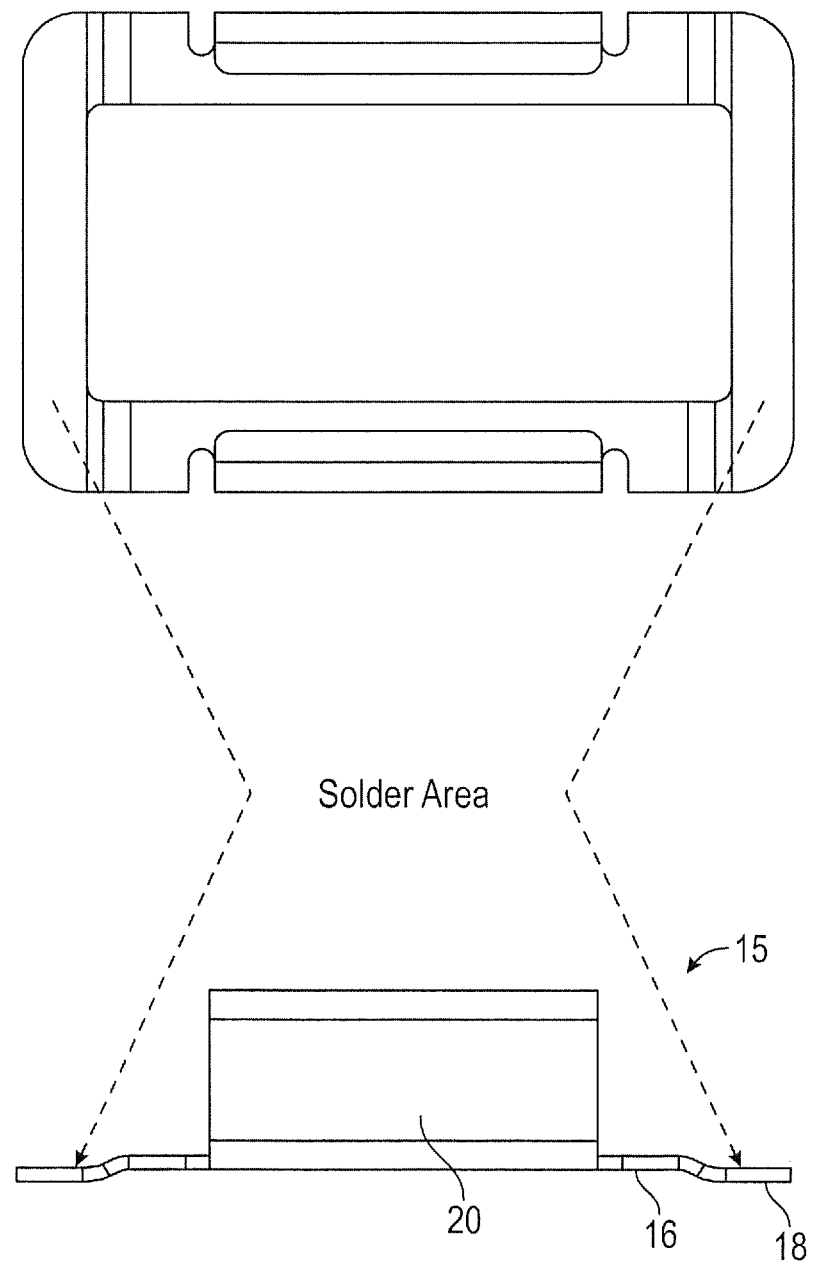
FIG. 7 is a side view of the component shown in FIG. 2.
Figure 8A:
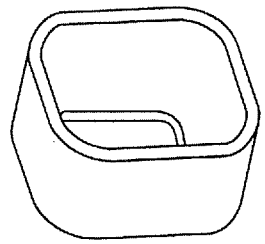
FIGS. 8A-8F are perspective views of alternative reflective designs usable with the device of FIG. 1.
Figure 8D:
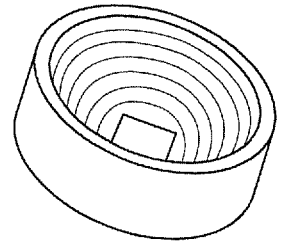
Figure 8B:
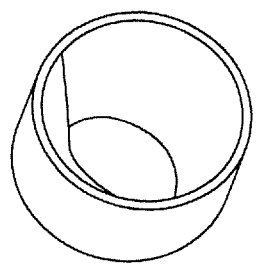
Figure 8E:
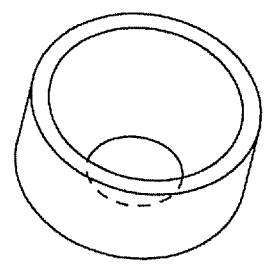
Figure 8C:
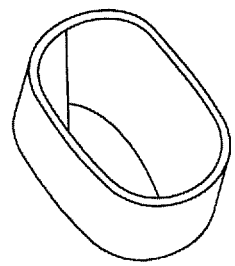
Figure 8F:
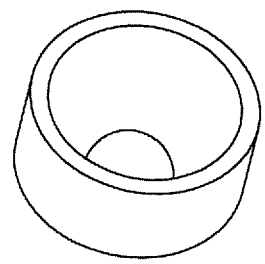
Figure 9:
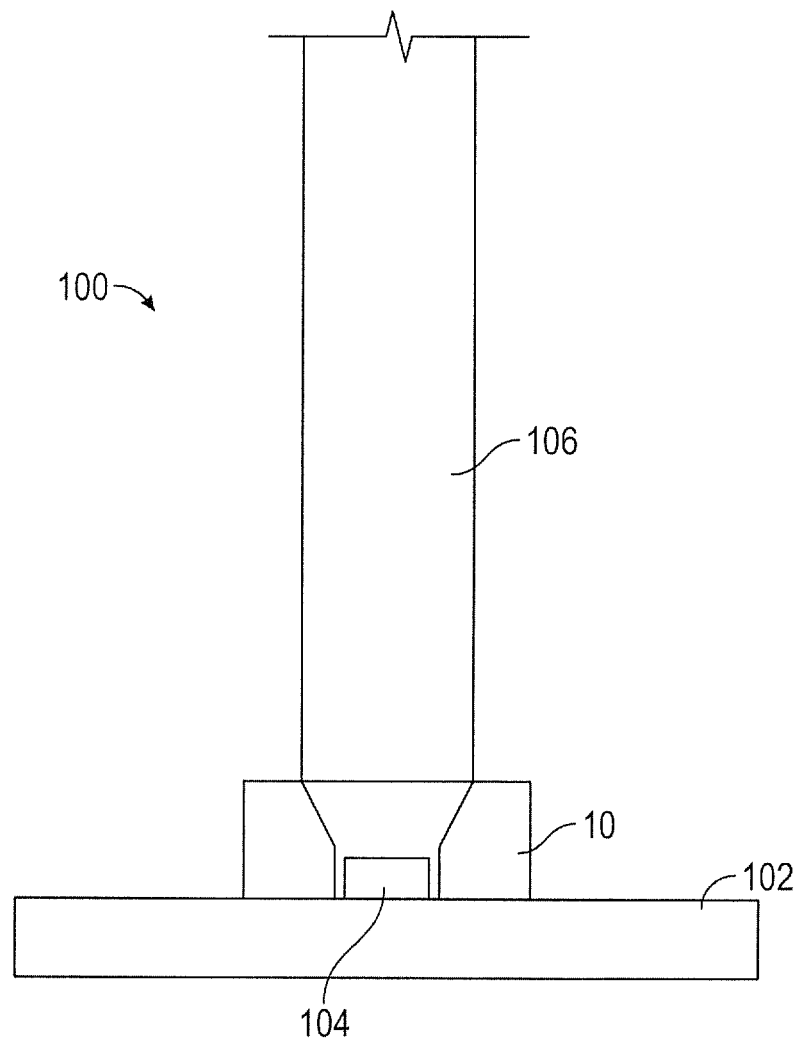
FIG. 9 is an elevational cross section of a light guide assembly using the surface-mount device.

As seen in FIG. 7, the transverse members 18 of lead frame clip 15 are offset away from longitudinal members 16, such that upon reflow soldering, only the transverse members are in contact with the PCB.

Illustrated reflectors 14 are non-limiting examples of functional features that can be incorporated into the body 12. Other reflector designs, illustrated in FIGS. 8A-8F, have different shapes to produce various desired light intensity distribution patterns. Lenses, optical filters, polarizers and/or other optical components can be supported on or integrated onto body 12.

Surface-mount devices in accordance with this disclosure can also be used or modified to be used as component protectors, such as for LEDs, capacitive sensors or other electronic components, which can be located generally within or at a through-hole or aperture extending from a bottom surface of the surface-mount device adjacent a PCB on which the protected electronic component is mounted to a top surface.

The disclosed surface-mount devices can also be used in combination with a light pipe (optical wave guide) to efficiently propagate light from an LED to a display panel. Such arrangements can be used, for example, in billboard displays, stadium displays, or vehicle instrument panels. The light guide assembly 100 includes a PCB 102, an LED 104 mounted on the PCB, a surface-mount device 10 as described, and an optical wave guide 106.

In an alternative embodiment, the solderable support can be partially embedded within the dielectric body using insert molding techniques. In such case, for example, two solder pad members, one at each end of the device, can be provided with extrusions that are embedded within the dielectric body.

The surface-mount devices (SMD) can be installed using conventional surface-mount technology. For example, the SMD can be positioned over an electronic component on a circuit board either manually or using a pick-and-place machine. Prior to placement, a solder paste can be applied to solder pads on the SMD and/or to non-functional solder pads on the PCB to provide temporary fixation of the SMD to the PCB. Thereafter, the PCB with attached SMD can be placed in a solder reflow oven and heated to a temperature that melts the solder in the solder paste. After cooling, a strong physical connection is established. Alternatively, the electronic component and the SMD can be mounted simultaneously, such as by adhesively or mechanically fixing the electronic component to the SMD to form an assembly that is placed on the PCB and joined thereto using conventional service-mount technology.

While the present invention is described herein with reference to illustrated embodiments, it should be understood that the invention is not limited hereto. Those having ordinary skill in the art and access to the teachings herein will recognize additional modifications and embodiments within the scope thereof. Therefore, the present invention is limited only by the claims attached herein.

What is claimed is:

1. A surface-mount device comprising:
   a dielectric body;
   an optical component supported on or integrated onto the dielectric body; and
   a solderable metal or metal alloy support clipped on to or embedded in the dielectric body and having solder pads offset from a bottom of the dielectric body to facilitate solder reflow mounting of the device to a printed circuit board.

2. The surface-mount device of claim 1, wherein at least one through-hole is defined in the dielectric body.

3. The surface-mount device of claim 1, wherein the dielectric body comprises a plastic material.

4. The surface-mount device of claim 1, wherein the solderable support comprises an alloy of copper.

5. The surface-mount device of claim 1, wherein the dielectric body and solderable support are snap-fit together.

6. The surface-mount device of claim 2, wherein the through-hole defines a reflector for focusing light emitted from an LED positioned in the recess.

7. The surface-mount device of claim 6, wherein surfaces of the reflector are provided with a metalized coating.

8. The surface-mount device of claim 1, wherein the solderable metal support is a clip configured to resiliently engage features of the dielectric body.

9. The surface-mount device of claim 1, wherein the solderable metal support is partially embedded in the dielectric body.

10. The surface-mount device of claim 1, wherein the optical component is a reflector.

11. An electronic assembly, comprising:
    a printed circuit board;
    an electronic device mounted directly on the printed circuit board; and
    a surface-mount device including a dielectric body defining at least one through-hole positioned over and around the electronic device, and including a solderable support connected with the dielectric body and soldered to the printed circuit board.

12. The assembly of claim 11, wherein the electronic device is an LED, and the through-hole defines a reflector for focusing light from the LED.

13. The assembly of claim 12, wherein a surface of the reflector is provided with a metalized coating.

14. The assembly of claim 11, wherein the solderable metal support is a clip configured to resiliently engage features of the dielectric body.

15. The assembly of claim 11, wherein the solderable metal support is partially embedded in the dielectric body.

* * * * *